United States Patent [19]
Lee

[11] Patent Number: 6,040,722
[45] Date of Patent: Mar. 21, 2000

[54] POWER-ON RESET CIRCUIT WITH ADJUSTABLE INTERVAL

[75] Inventor: Sang-oh Lee, Seoul, Rep. of Korea

[73] Assignee: Samsung Electronics, Co., Ltd., Suwon, Rep. of Korea

[21] Appl. No.: 09/071,518

[22] Filed: May 1, 1998

[30] Foreign Application Priority Data

May 2, 1997 [KR] Rep. of Korea ............ 97-16951

[51] Int. Cl.[7] .................................................. H03L 7/00
[52] U.S. Cl. ................................. 327/143; 327/198
[58] Field of Search ............................ 327/142, 143, 327/198

[56] References Cited

U.S. PATENT DOCUMENTS

| | | | |
|---|---|---|---|
| 4,797,584 | 1/1989 | Aguti et al. | 594/327 |
| 5,343,085 | 8/1994 | Fujimoro et al. | 307/272.3 |
| 5,369,311 | 11/1994 | Wang et al. | 327/292 |
| 5,408,139 | 4/1995 | Hayano | 143/327 |
| 5,414,307 | 5/1995 | Brandmaier | 327/143 |
| 5,442,310 | 8/1995 | Bazes | 327/143 |
| 5,510,741 | 4/1996 | Childs | 327/143 |
| 5,513,358 | 4/1996 | Lundberg et al. | 395/750 |
| 5,559,458 | 9/1996 | Holler, Jr. | 327/143 |

*Primary Examiner*—Jeffrey Zweizig
*Attorney, Agent, or Firm*—Marger Johnson & McCollom, P.C.

[57] ABSTRACT

A power-on reset circuit is provided for generating a power-on reset signal for sequential logics or memory devices as a power supply potential is applied initially. The power-on reset circuit is provided in the same chip as the sequential logics, and generates the signal after an adjustable time interval. The power-on reset circuit includes an oscillator for generating a clock signal, and a counter for counting pulses of the clock signal from when the power supply potential is applied. The time interval is adjusted by loading a preset data value in the counter, which thus outputs a CTR signal when the counted pulses become equal in number to the preset number. A combinational logic circuit resets the counter when the power supply potential is initially applied, and also generates a power-on reset signal when the counter outputs the CTR signal. The power on reset signal further disables the counter, so that the CTR signal is maintained.

15 Claims, 4 Drawing Sheets

POWER-ON RESET CIRCUIT WITH ADJUSTABLE INTERVAL

FIELD OF THE INVENTION

The present invention relates generally to a semiconductor integrated circuit device, and more particularly, to a power-on reset circuit for generating a power-on reset signal to reset sequential logics to desired logic states when a power supply potential is applied.

BACKGROUND OF THE INVENTION

FIG. 1 is a circuit diagram showing a conventional semiconductor integrated circuit (IC) device including a power-on reset circuit. In this figure, the conventional IC device includes a power supply potential node 1 supplied with a power supply potential $V_{DD}$, and a ground potential node 2 connected to the ground potential. The conventional IC device further includes a power-on reset circuit 20 which receives power supply potential $V_{DD}$, and generates a power-on reset signal. When the power supply potential rises from the ground potential to a prescribed potential $V_{DD}$ (for example, 5 V), the power-on reset signal is maintained at LO for a prescribed time period, and then is changed to HI.

The conventional IC device further includes an internal circuit 10 having, for example, sequential logic circuits or memory devices which are driven by power supply potential $V_{DD}$. When the power-on reset signal is applied to internal circuit 10, the latter is immediately reset to desired logic states.

Referring again to FIG. 1, power-on reset circuit 20 includes a capacitor 3 connected between ground potential node 2 and a connection node 5, a resistor 4 connected between power supply potential node 1 and connection node 5, and a buffer 22 connected between connection node 5 and a reset terminal of internal circuit 10.

When power supply potential $V_{DD}$ is applied, a voltage V_RC at connection node 5 of time delay circuit 21 rises from zero up to high level $V_{DD}$, but with a delay in accordance with the time constant RC of resistance R and capacitance C, of the resistor and the capacitor. The delayed voltage V_RC is provided to buffer 22, which has a threshold voltage $V_{thresh}$. The buffer outputs a power-on reset signal of low level when V_RC is smaller than $V_{thresh}$, and of high level when V_RC is higher $V_{thresh}$.

Referring to the timing chart of FIG. 2, the conventional IC device operates as follows. At the time of power-up, power supply potential $V_{DD}$ starts rising from the ground potential at time t0, and reaches the prescribed potential at time t1. At this time, power-on reset signal is LO, and voltage V_RC starts rising toward $V_{DD}$ with a time-constant. The time profile of voltage V_RC can be obtained by the following equation:

$$V\_RC(t) = V_{DD}\left[1 - e^{\frac{-(t-t0)}{RC}}\right]$$

Voltage V_RC will reach the threshold voltage value $V_{thresh}$ after a delay time $t_d$, which is also known as interval of power-on reset time. Neglecting a delay time of the buffer itself, the value of $t_d$ is found by the following equation:

$$t_d = -RC \cdot \ln\left[1 - \frac{V_{thresh}}{V_{DD}}\right]$$

When the threshold value is reached, power-on reset signal PWR_ON_RESET is changed from LO to HI. The power-on reset signal is applied to sequential logics or memory devices of internal circuit 10, to reset them to desired logic states. After this time, the power-on reset signal is maintained at high level and thereby the sequential logics or the memory devices are not influenced by the power-on reset signal.

As described immediately above, the power-on reset signal can be obtained using the RC time delay of circuit 21. For a longer delay, a capacitance of capacitor 3 must be increased. Since capacitors having a large capacitance occupy a larger space on a device chip, such capacitors should be formed outside the device chip, as in FIG. 1. This reduces the degree of integration of the device chip, and inevitably requires allocating an input/output pin of the device chip should be for the external capacitor.

SUMMARY OF THE INVENTION

The present invention overcomes the problems of the prior art.

According to an aspect of the present invention, there is provided a power-on reset circuit for generating a power-on reset signal as a power supply potential is applied initially. The signal is applied to sequential logics after an adjustable time interval, so as to allow them to reset to desired logic states immediately thereafter.

The power-on reset circuit includes an oscillator for generating a clock signal, and a counter for counting pulses of the clock signal from when the power supply potential is initially applied. The time interval is adjusted by loading a preset data value in the counter. The counter comprises an n-bit counter, and the preset data value is loaded by coding the n bits. The counter outputs a CTR signal when the counted pulses become equal in number to the preset number.

The circuit also includes a combinational logic circuit that generates a reset signal for resetting the counter when the power supply potential is initially applied. The combination logic circuit also generates a power-on reset signal when the counter outputs the CTR signal.

It is further preferred that the counter is disabled by the power-on reset signal, so as to maintain the CTR signal at the same value. The oscillator can also be disabled by the power-on reset signal.

The power-on reset circuit of the invention is incorporated in the same chip as the sequential logics, regardless of how long is the interval of power-on reset time has been adjusted for. Because the power-on reset circuit is embodied in the chip, there is no need for the chip to allocate an input/output pin for the power-on reset circuit.

BRIEF DESCRIPTION OF THE DRAWINGS

This invention may be understood and its objects will become apparent to those skilled in the art by reference to the accompanying drawings as follows.

DETAILED DESCRIPTION OF PREFERRED EMBODIMENT

Figure 1:
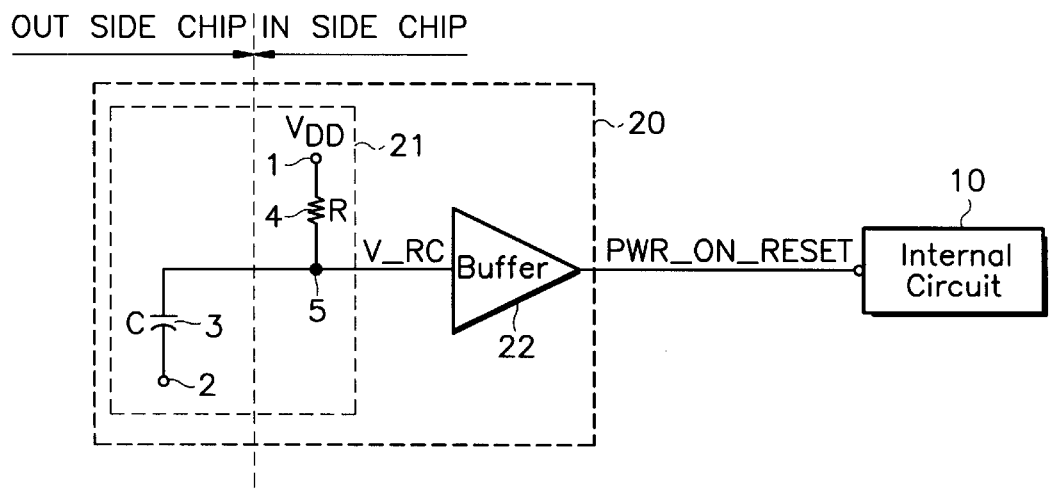
FIG. 1 is a circuit diagram showing a conventional semiconductor integrated circuit including a power-on reset circuit.
Figure 2:
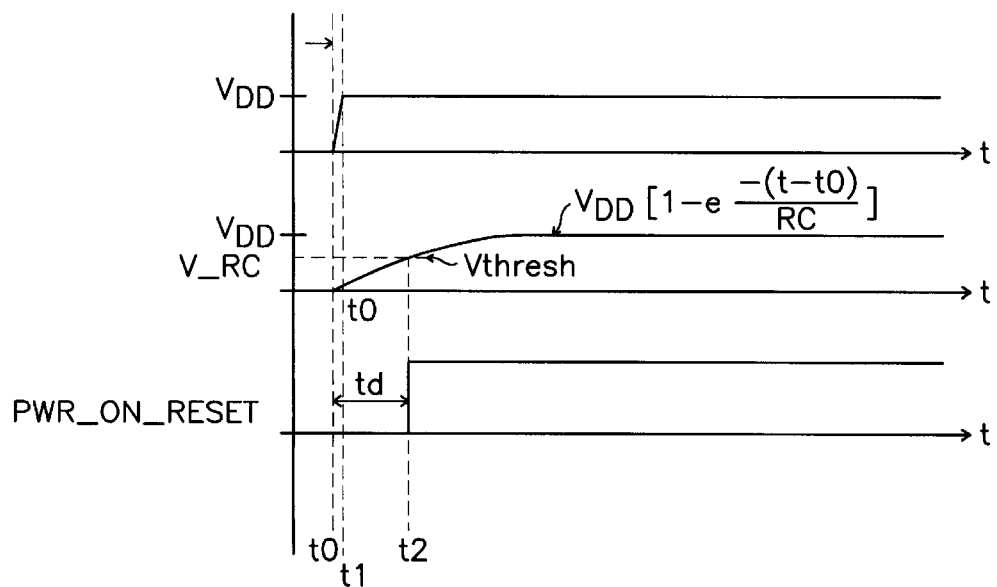
FIG. 2 is a timing chart showing the operation of the power-on reset circuit of FIG. 1.
Figure 3:
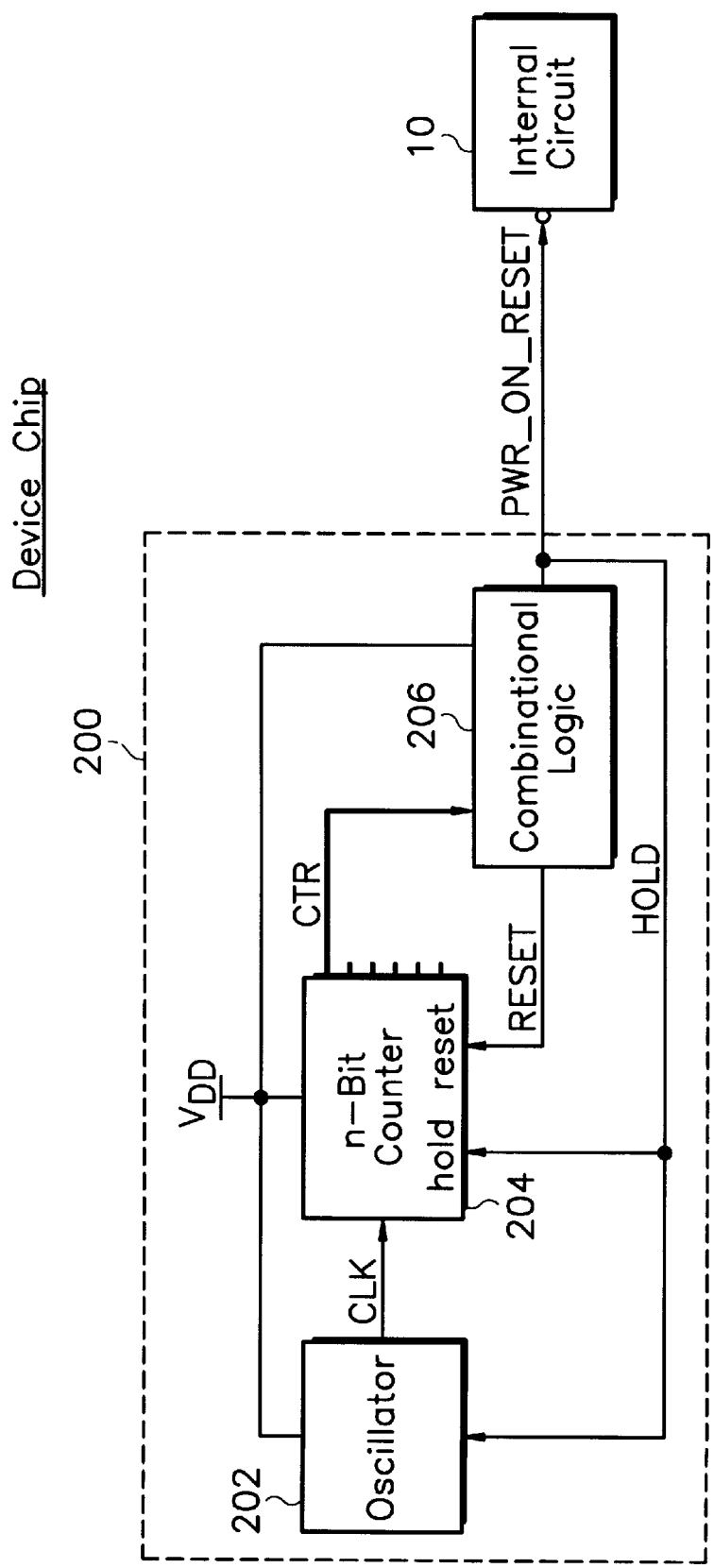
FIG. 3 is a block diagram showing a power-on reset circuit according to a preferred embodiment of the present invention.

A novel power-on reset circuit 200 made in accordance with the preferred embodiment of the present invention is now described with reference to FIG. 3. Circuit 200 includes an oscillator 202, an n-bit counter 204 and a combinational logic 206. Power-on reset circuit 200 is integrated in a device chip, together with an internal circuit 10 having sequential logics or memory devices. Power-on reset circuit 200 generates a power-on reset signal when a power supply potential is applied, and enables internal circuit 10 to reset to desired logic states immediately thereafter.

When power supply potential VDD is applied to the device chip, oscillator 202 generates a clock signal CLK having a constant frequency. At the same time, n-bit counter 204 is reset, and then starts a counting operation in synchronization with clock signal CLK. The counter counts up, and generates a pulse signal when a counted value becomes equal to a preset loaded data value.

Combinational logic 206 resets the counter by providing a RESET signal when power supply potential VDD is initially applied. The combinational logic also outputs a hold signal HOLD that disables further counting up, when the counted value has become equal to the preset loaded data value. Thus output signal CTR of the counter is held at its output level.

Combinational logic 206 also outputs a power-on reset signal PWR_ON_RESET, which is provided to a reset terminal of internal circuit 10. In the preferred embodiment, the power-on reset signal of high level is advantageously used also as the hold signal for counter 204, and also for oscillator 202. As a result, the oscillator is inactivated by power-down control, and at the same time the output signal CTR of the counter is held at the high level.

Figure 4:
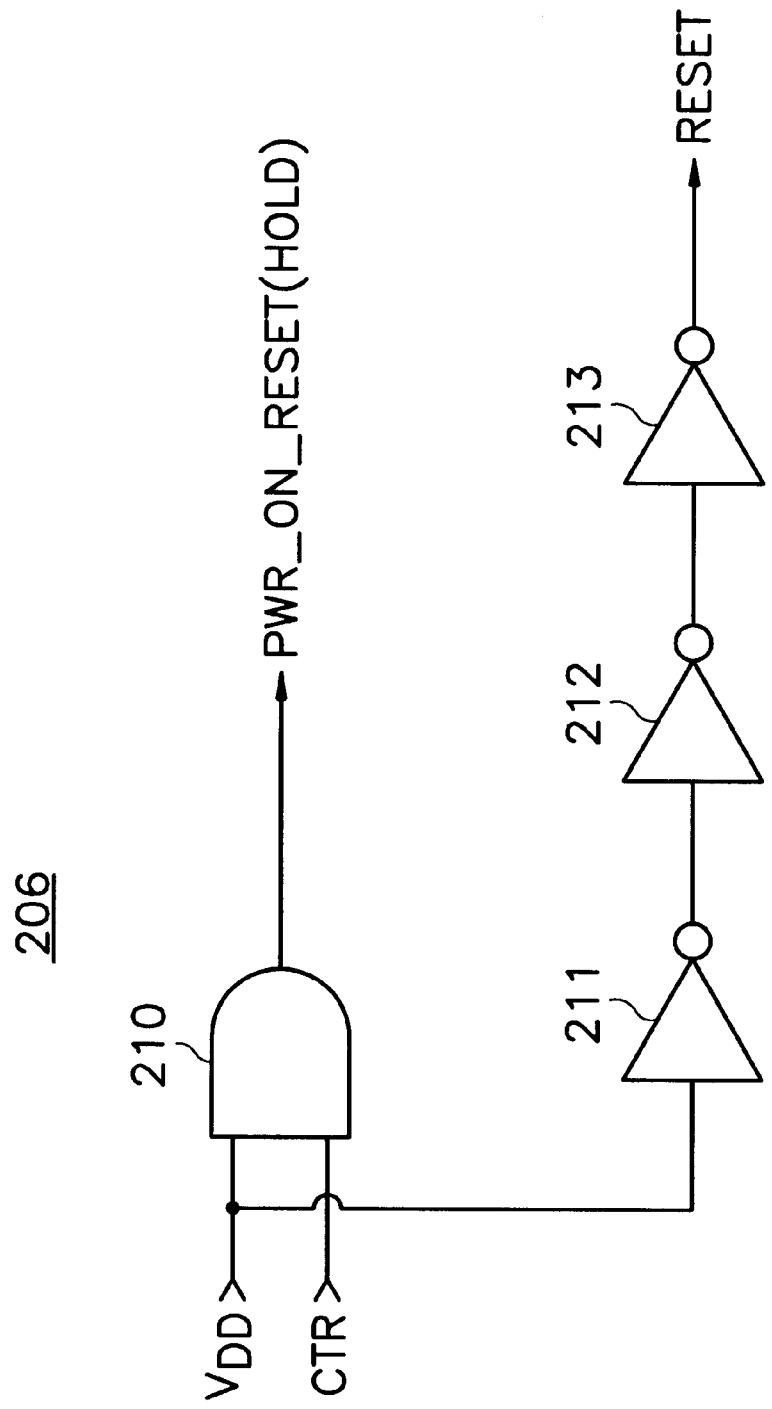
FIG. 4 is a detailed circuit diagram for the combinational logic of the power-on reset circuit shown in FIG. 3.

FIG. 4 is a detailed circuit diagram for combinational logic 206. In this figure, combinational logic 206 includes an AND gate circuit 210 having two input terminals, one of which receives power supply potential VDD, and the other of which receives output signal CTR of counter 204. The power-on reset signal PWR_ON_RESET is generated at the output of AND gate circuit 210.

The combinational logic further includes a plurality of inverters 211~213 which are connected in series. First stage inverter 211 receives power supply potential $V_{DD}$, and third stage inverter 213 outputs counter reset signal RESET.

Figure 5:
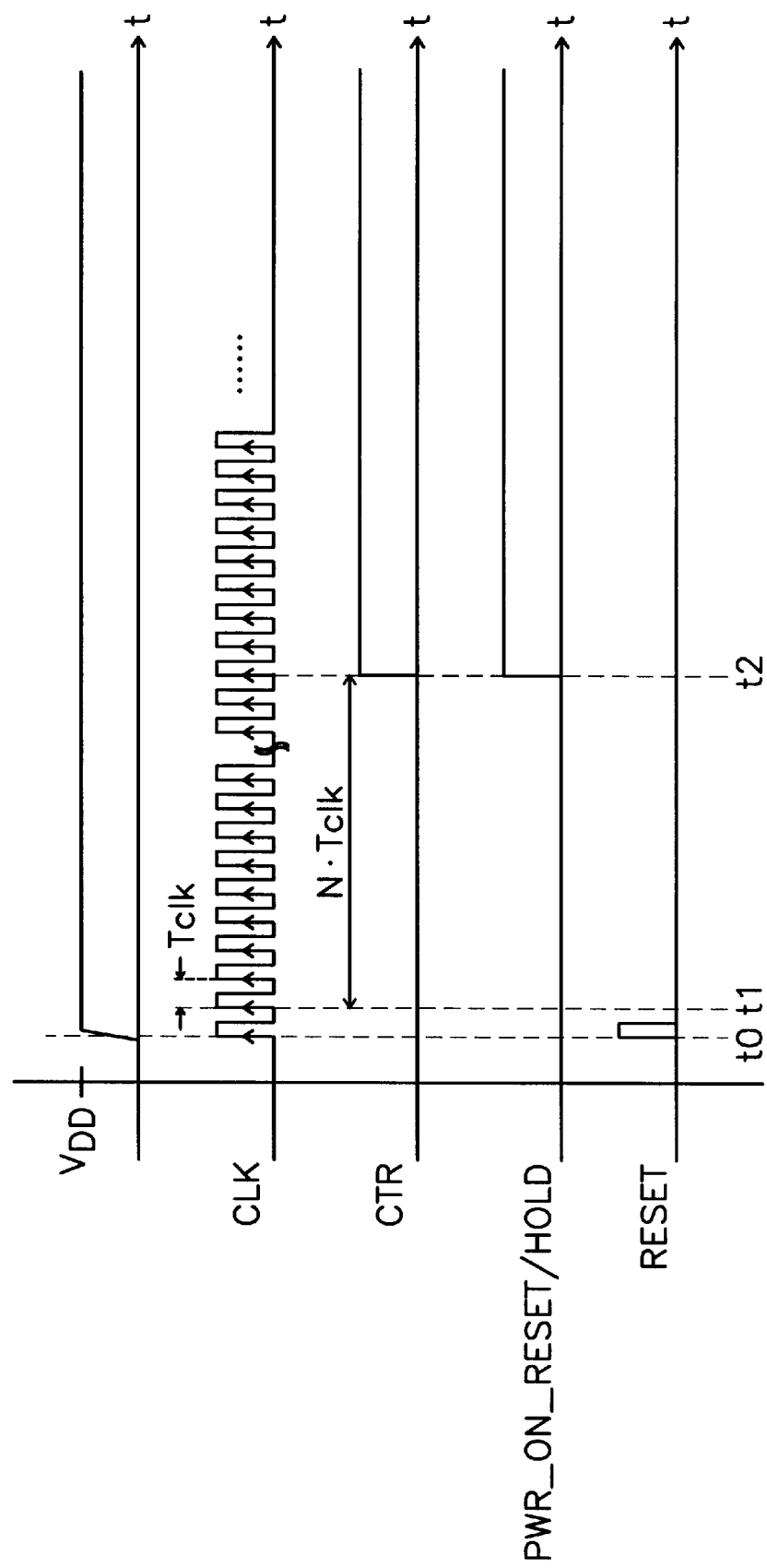
FIG. 5 is a timing chart for the circuit of FIG. 3.

The operation of power-on reset circuit 200 is now described with reference to FIGS. 3 through 5. When external power supply potential $V_{DD}$ rises from a ground potential toward the prescribed potential, oscillator 202 starts to generate a clock signal CLK having a constant period $T_{clk}$. In addition, combinational logic 206 produces a counter reset pulse RESET, which resets counter 204. The counter then starts to count up an initial data in synchronization with the clock signal CLK which is generated from time t1.

At time t2, a counted data of the counter reaches up to the preset data value. At that time, signal CTR is changed from low level ("LO") to high level ("HI"), and thus the power-on reset signal PWR_ON_RESET is also changed from LO to HI. Sometimes this change is also referred to as providing the power-on reset signal. As a result, sequential logics or memory devices of internal circuit 10 are reset.

As described above, the power-on reset signal is advantageously applied to counter 204 and to oscillator 202 as a hold signal. Accordingly, signal CTR is maintained HI, and the oscillator is inactivated.

Table 1 shows operational states of oscillator 202 and counter 204 in response to the hold signal HOLD and counter reset signal RESET.

TABLE 1

| Output of Combinational Logic | Operational State | |
| --- | --- | --- |
| | N-bit Counter | Oscillator |
| HOLD signal on | hold state | off state |
| RESET Signal | reset state | — |

With power-on reset circuit 200, the interval of power-on reset time td can be represented by the following equation:

$$t_d = N \cdot T_{clk}$$

wherein $T_{clk}$ is the constant period of the clock signal which is generated from oscillator 202.

The value of delay time td can be controlled according to the above equation to be a predetermined time interval. Once $T_{clk}$ is known, controlling is accomplished by proper choice of the number N in the above equation, which is the number of clock pulses between times t1 and t2. The number N is loaded in the counter as the preset data value. For a counter that is an n-bit counter, n being an integer, N must be between $1 \leq N \leq 2^{n-1}$. N is loaded by properly setting the n bits.

What is claimed is:

1. A power-on reset circuit for use with sequential logics, for generating a power-on reset signal as a power supply potential is applied, so as to allow the sequential logics to reset immediately to desired logic states, said circuit comprising:

an oscillator for generating a clock signal as the power supply potential is applied;

a counter for counting an initial data in synchronization with the clock signal to generate a counted data;

a combinational logic circuit coupled to the sequential logic, said combinational logic circuit having a power supply input coupled to the power supply potential for generating a counter reset signal used to reset the counter when the power supply potential is applied, and generating the power-on reset signal when the counted data is equal to a preset data; and means for simultaneously disabling said oscillator and said counter, wherein each of said oscillator and said counter includes an input for receiving the power-on reset signal, said counter also including a second input for receiving the reset signal from said combinational logic circuit and resetting said counter responsive to said reset signal.

2. The power-on reset circuit according to claim 1, wherein said combinational logic circuit comprises an AND gate circuit having two input terminals, one of which receives the power supply potential and the other of which receives the counted data equal to the preset data, for generating the power-on reset signal at an output terminal thereof, and at least one inverter for receiving the power supply potential to generate the counter reset signal.

3. The power-on reset circuit according to claim 1, wherein said power-on reset circuit is incorporated in a single chip in which the sequential logics are embodied.

4. The power-on reset circuit according to claim 1, wherein said counter comprises an n-bit counter.

5. The power-on reset circuit according to claim 4, wherein a data value of n bits preset in the n-bit counter is equal to the preset data, where n is integer.

6. The power-on reset circuit according to claim 5, wherein the preset data is equal to the number of clocks which are generated from the counter.

7. The power-on reset circuit of claim 1, the combinational logic circuit including an odd-number of inverters from which the counter reset signal is generated.

8. A power-on reset circuit for use with sequential logics, for generating a power-on reset signal at a predetermined time interval after a power supply potential is applied so as to allow the sequential logics to reset to desired logic states immediately thereafter, said circuit comprising:

an oscillator for generating a periodic clock signal;

a counter for counting periods of the clock signal, the counted periods reaching a number equal to a preset number after a time corresponding to the predetermined time interval;

a combinational logic circuit coupled to the sequential logics for generating a reset signal when the power supply potential is applied and the power-on reset signal when the counted periods are of a number equal to the preset number; and means for simultaneously disabling said oscillator and said counter responsive to said power-on reset signal generated by said combinational logic circuit;

wherein each of said oscillator and said counter includes an input for receiving the power-on reset signal, said counter also including a second input for receiving the reset signal from said combinational logic circuit and resetting said counter responsive to said reset signal.

9. The circuit of claim 8, wherein the counter is disabled in response to the power-on reset signal, the combinational logic thereby maintaining the generated power-on reset signal thereafter.

10. The circuit of claim 8, wherein the counter outputs a counter signal that changes its state from LO to HI when the counted periods are of a number equal to a preset number, and wherein said combinational logic circuit comprises:

at least one inverter for receiving the power supply potential to generate the reset signal; and an AND gate circuit having two input terminals, one of which receives the power supply potential and the other of which receives the counter signal, to generate the power-on reset signal at an output terminal thereof.

11. The circuit of claim 10, wherein the counter is disabled in response to the power-on reset signal, the combinational logic thereby maintaining the generated power-on reset signal thereafter.

12. The power-on reset circuit according to claim 8, wherein the power-on reset circuit is incorporated in a single chip in which the sequential logics are also embodied.

13. The power-on reset circuit of claim 7, the combinational logic circuit including an odd-number of inverters from which the reset signal is generated.

14. A method for outputting a delayed power-on reset signal to an internal circuit for resetting logics of the internal circuit to desired logic states, the method comprising:

interposing a power-on reset circuit having an oscillator, a counter, and a combinational logic circuit between a power supply potential and the internal circuit;

setting a preset data value within the counter supplying a power supply potential to the oscillator, counter and combinational logic circuit;

sending a reset signal from the combinational logic circuit to the counter responsive to an initial onset of the power supply potential;

enabling the oscillator responsive to the initial onset of the power supply potential thereby transmitting a clock signal to the counter;

counting an initial data in synchronization with the clock signal to generate a counted data;

comparing within the counter the counted data to the preset data value;

transmitting a counter signal to the combinational logic when the counted data is equal to the present data value;

generating a power-on reset signal within the combinational logic circuit responsive to the counter signal;

transmitting the power-on reset signal to the internal circuit, the oscillator and the counter; and simultaneously disabling the oscillator and the counter responsive to the power-on reset signal.

15. The method of claim 14, further including the step of outputting the reset signal from an odd-number of inverters within the combinational logic circuit.

* * * * *

UNITED STATES PATENT AND TRADEMARK OFFICE
CERTIFICATE OF CORRECTION

PATENT NO.  : 6,040,722
DATED       : March 21, 2000
INVENTOR(S) : Lee

It is certified that error appears in the above-identified patent and that said Letters Patent is hereby corrected as shown below:

Column 3,
Lines 21, 29 and 47, "VDD" should read -- $V_{DD}$ --.

Column 4,
Lines 23 and 28, "td" should read -- $t_d$ --.

Signed and Sealed this

Twenty-fifth Day of June, 2002

Attest:

Attesting Officer

JAMES E. ROGAN
Director of the United States Patent and Trademark Office